United States Patent
Harauchi et al.

(10) Patent No.: US 10,468,323 B2
(45) Date of Patent: Nov. 5, 2019

(54) HIGH FREQUENCY MODULE

(71) Applicant: Mitsubishi Electric Corporation, Chiyoda-ku (JP)

(72) Inventors: Kenji Harauchi, Chiyoda-ku (JP); Fuminori Sameshima, Chiyoda-ku (JP); Jun Nishihara, Chiyoda-ku (JP); Yoshinori Tsuyama, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/132,956

(22) Filed: Sep. 17, 2018

(65) Prior Publication Data
US 2019/0019738 A1 Jan. 17, 2019

Related U.S. Application Data

(63) Continuation of application No. 15/504,240, filed as application No. PCT/JP2015/073829 on Aug. 25, 2015, now Pat. No. 10,109,552.

(30) Foreign Application Priority Data

Aug. 26, 2014 (JP) ................. 2014-171058

(51) Int. Cl.
*H05K 1/02* (2006.01)
*H01L 23/367* (2006.01)
(Continued)

(52) U.S. Cl.
CPC ............ *H01L 23/367* (2013.01); *H01L 23/36* (2013.01); *H01L 23/552* (2013.01); *H01L 23/66* (2013.01);
(Continued)

(58) Field of Classification Search
CPC .. H05K 1/0203; H05K 1/0204; H05K 1/0206; H05K 1/0207; H05K 1/0209; H05K 1/021; H05K 1/0216
See application file for complete search history.

(56) References Cited

U.S. PATENT DOCUMENTS

2002/0000895 A1* 1/2002 Takahashi ............ H03H 9/0576
333/133
2004/0154815 A1 8/2004 Gustafsson et al.
(Continued)

FOREIGN PATENT DOCUMENTS

CN 101944653 A 1/2011
CN 102027590 A 4/2011
(Continued)

OTHER PUBLICATIONS

International Search Report dated Nov. 2, 2015, in PCT/JP2015/073829 filed Aug. 25, 2015.
(Continued)

*Primary Examiner* — Hoa C Nguyen
(74) *Attorney, Agent, or Firm* — Oblon, McClelland, Maier & Neustadt, L.L.P.

(57) ABSTRACT

A high frequency module improved in heat dissipation performance includes: a dielectric multilayer substrate including a ground layer and a high frequency electronic component mounted thereon while being in contact with the ground layer, the high frequency electronic component including a heat generating portion; and a cutoff block formed of an upstanding wall portion and a cover portion covering the upstanding wall portion, the cutoff block housing the high frequency electronic component and including a hollow portion having a cutoff characteristic at a frequency of a high frequency signal used by the high frequency electronic component, and the upstanding wall portion of the
(Continued)

cutoff block being in contact with the ground layer of the dielectric multilayer substrate.

8 Claims, 5 Drawing Sheets

(51) Int. Cl.
| | |
|---|---|
| *H01L 23/36* | (2006.01) |
| *H05K 7/20* | (2006.01) |
| *H01Q 9/28* | (2006.01) |
| *H01L 23/552* | (2006.01) |
| *H01L 23/66* | (2006.01) |
| *H01L 25/07* | (2006.01) |
| *H01L 25/18* | (2006.01) |
| *H01Q 1/02* | (2006.01) |
| *H01Q 1/22* | (2006.01) |
| H01L 23/427 | (2006.01) |
| H01L 21/48 | (2006.01) |

(52) U.S. Cl.
CPC ............ *H01L 25/072* (2013.01); *H01L 25/18* (2013.01); *H01Q 1/02* (2013.01); *H01Q 1/2283* (2013.01); *H01Q 9/285* (2013.01); *H05K 1/0206* (2013.01); *H05K 7/20* (2013.01); *H01L 21/486* (2013.01); *H01L 23/3675* (2013.01); *H01L 23/427* (2013.01); *H01L 2223/6677* (2013.01); *H01L 2224/48091* (2013.01); *H01L 2224/48247* (2013.01); *H01L 2924/1423* (2013.01); *H01L 2924/16152* (2013.01)

(56) References Cited

U.S. PATENT DOCUMENTS

| | | |
|---|---|---|
| 2007/0159380 A1 | 7/2007 | Nagaishi et al. |
| 2010/0164783 A1 | 7/2010 | Choudhury |
| 2010/0315799 A1 | 12/2010 | Suzuki |
| 2015/0070851 A1* | 3/2015 | Kitazaki ................ H05K 3/301 361/729 |
| 2015/0171020 A1* | 6/2015 | Shibuya .............. H01L 23/3128 257/659 |
| 2015/0296667 A1* | 10/2015 | Hirose .................. H01L 21/568 427/126.2 |

FOREIGN PATENT DOCUMENTS

| | | |
|---|---|---|
| JP | 01-154607 A | 6/1989 |
| JP | 4-96295 A | 3/1992 |
| JP | 7-263887 A | 10/1995 |
| JP | 9-102579 A | 4/1997 |
| JP | 10-125830 A | 5/1998 |
| JP | 2000-228452 A | 8/2000 |
| JP | 2000-236045 A | 8/2000 |
| JP | 2004-47576 A | 2/2004 |
| JP | 2007-116217 A | 5/2007 |
| JP | 2011-165931 A | 8/2011 |
| JP | 2013-211368 | 10/2013 |

OTHER PUBLICATIONS

Japanese Office Action dated Nov. 7, 2017 in Patent Application No. 2016-545541 (with English translation), 9 pages.
Japanese Office Action dated Mar. 13, 2018 in Patent Application No. 2016-545541 (with English translation), 7 pages.
Extended European Search Report dated Mar. 26, 2018 in European Patent Application No. 15835438.1, 7 pages.
Office Action dated Jul. 24, 2018 in Chinese Patent Application No. 201580046563.7, with English-language translation, 14 pages.
Office Action dated May 7, 2019 in Japanese Patent Application No. 2018-163012, with English-language translation, 10 pages.

* cited by examiner

HIGH FREQUENCY MODULE

CROSS-REFERENCE TO RELATED APPLICATIONS

This application is a continuation of U.S. application Ser. No. 15/504,240 filed Feb. 15, 2017, which is a National Stage of PCT/JP2015/073829 filed Aug. 25, 2015 and claims priority to Japanese Patent Application No., 2014-171058 filed Aug. 26, 2014. The entire contents of each of which are incorporated herein by reference.

TECHNICAL FIELD

The present invention relates to a high frequency module having a high frequency integrated circuit configured to amplify a high frequency signal such as a microwave.

BACKGROUND ART

A high frequency module for amplifying a microwave signal is used for communication equipment for communication in a microwave band, radar equipment, a power transmission device, and the like. The high frequency module includes high frequency integrated circuits such as an FET (Field Effect Transistor) and an MMIC (Monolithic Microwave Integrated Circuit). Since a high frequency integrated circuit generates heat with its power consumption or the like, the high frequency module includes a heat dissipation sink and the like for cooling the high frequency integrated circuit. However, in the case where a mounting area is limited, the case where an antenna element is formed on the back surface of the dielectric multilayer substrate on which a high frequency integrated circuit is mounted, and the like, it is not possible to provide means for dissipating heat from the bonding surface of the high frequency integrated circuit directly to the heat dissipation sink, so that it becomes necessary to provide another cooling means.

For example, Japanese Patent Laying-Open No. 09-102579 (see PTD 1) discloses a high frequency module configured to have an external casing formed of an exterior metal cover, in which the side surface of an interior metal cover is internally in contact with the inside of this exterior metal cover. The high frequency module disclosed in PTD 1 includes, on the inside of the exterior metal cover, a dielectric substrate, a high frequency integrated circuit and a window. The dielectric multilayer substrate is housed inside the interior metal cover. The high frequency integrated circuit is mounted on the outside of the interior metal cover. The window is provided so as to penetrate through the interior metal cover and provided as an opening through which a wiring line passes, the wiring line being used for connecting the high frequency integrated circuit to the dielectric multilayer substrate.

CITATION LIST

Patent Document

PTD 1: Japanese Patent Laying-Open No. 09-102579

SUMMARY OF INVENTION

Technical Problem

According to the high frequency module disclosed in PTD 1, the interior metal cover equipped with a high frequency integrated circuit is internally in contact with the exterior metal cover, thereby allowing the heat emitted from the high frequency integrated circuit to be transmitted to the exterior metal cover, so that the heat emitted from the high frequency integrated circuit is released to the outside. Thus, for such a high frequency module, the interior metal cover needs to be processed by the number of times corresponding to the number of the mounted high frequency integrated circuits, with the result that the structure of the high frequency module becomes complicated.

The present invention has been made in order to solve the above-described problems. An object of the present invention is to obtain a high frequency module with excellent cooling performance, which allows the heat emitted from a high frequency integrated circuit to be efficiently dissipated to the outside in a simple structure without having to increase the number of components.

Solution to Problem

A high frequency module according to the present invention includes: a dielectric multilayer substrate having a ground layer and having a high frequency integrated circuit mounted thereon while being in contact with the ground layer, the high frequency integrated circuit being a heat generating element; and a cutoff block formed of an upstanding wall portion that contacts the ground layer of the dielectric multilayer substrate and a cover portion that covers the upstanding wall portion, the cutoff block housing the high frequency integrated circuit, being provided with a hollow portion having a cutoff characteristic at a frequency of a high frequency signal used by the high frequency integrated circuit, and being configured to dissipate heat generated in the high frequency integrated circuit and transferred through the ground layer. The dielectric multilayer substrate has: one surface on which the high frequency integrated circuit and the cutoff block are mounted; and the other surface on which an antenna element formed of a planar antenna is provided, the antenna element being configured to dissipate heat generated in the high frequency integrated circuit and transferred through the dielectric multilayer substrate.

Advantageous Effects of Invention

According to the present invention, it becomes possible to implement a high frequency module configured to transfer heat, which is generated by a high frequency integrated circuit, through a ground layer of a dielectric multilayer substrate to a cutoff block configured to improve cutoff characteristics so as to dissipate the heat, thereby improving the heat dissipation performance without having to increase the number of components.

DESCRIPTION OF EMBODIMENTS

Figure 5:
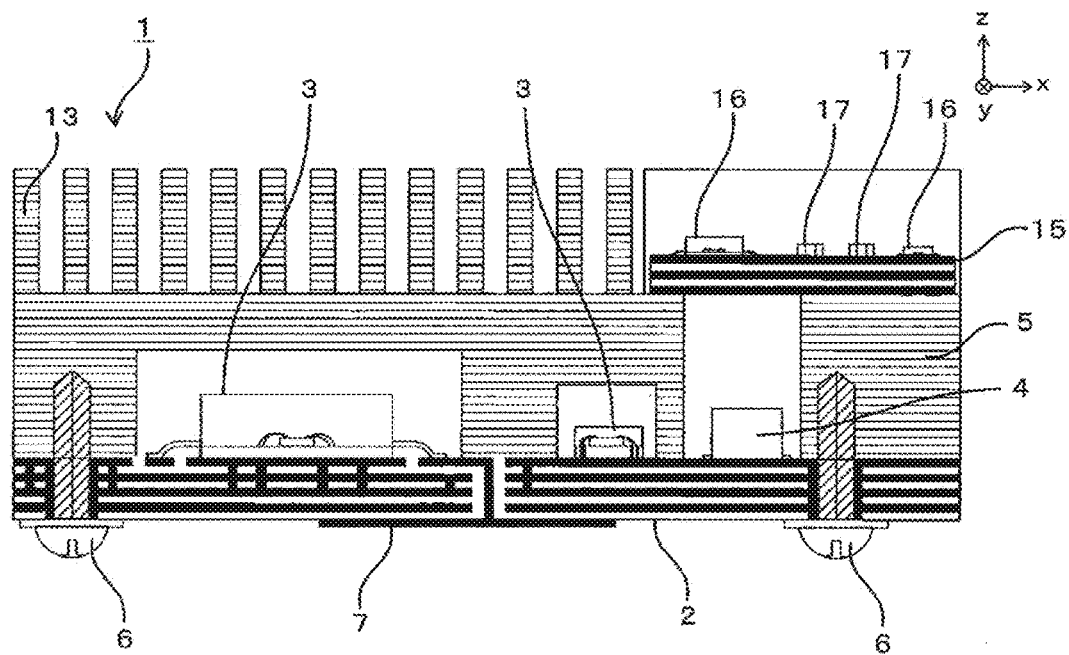
FIG. 5 is a cross-sectional view of a high frequency module according to the third embodiment of the present invention.
Figure 6:
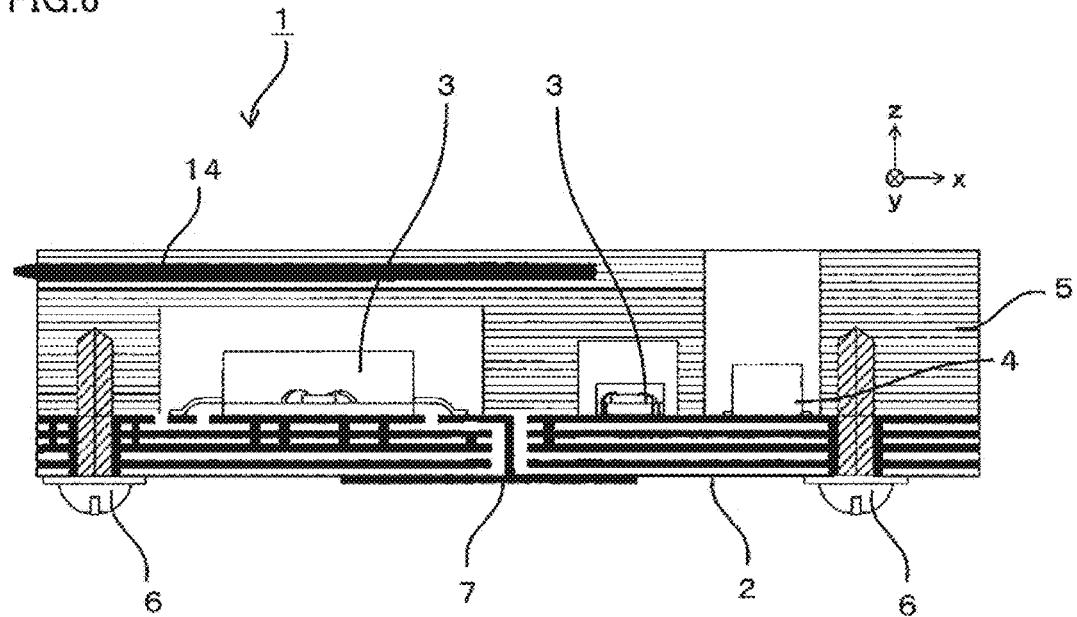
FIG. 6 is a cross-sectional view of a high frequency module according to the fourth embodiment of the present invention.
Figure 7:
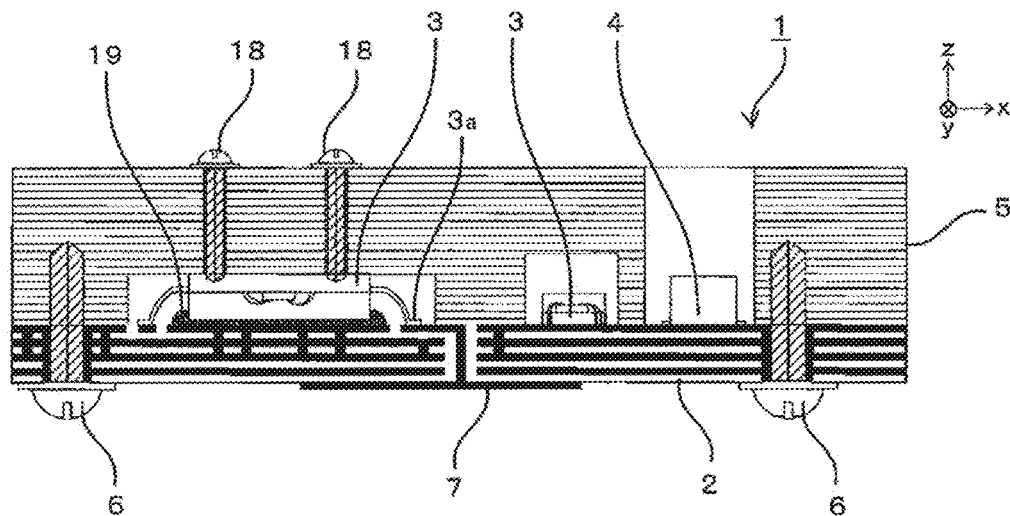
FIG. 7 is a cross-sectional view of a high frequency module according to the fifth embodiment of the present invention.

The X direction, the Y direction and the Z direction in the figures of the present application show the long side direction, the short side direction and the thickness direction, respectively, of a high frequency module 1. FIGS. 1, 2 and 4 to 9 each show a cross-sectional view of high frequency module 1 taken along the X-Z plane, showing a position including a portion in which a lock screw 6 is formed. Specially, FIG. 7 shows a cross-sectional view of high frequency module 1 taken along the X-Z plane, showing a position including a portion in which lock screw 6 and a screw 18 are formed. FIG. 3 shows a top-plan perspective view of the high frequency module taken along the X-Y plane. Specifically, the figure is a top-plan perspective view showing the inside of high frequency module 1 with cutoff block 5 shown in perspective view.

First Embodiment

Figure 1:
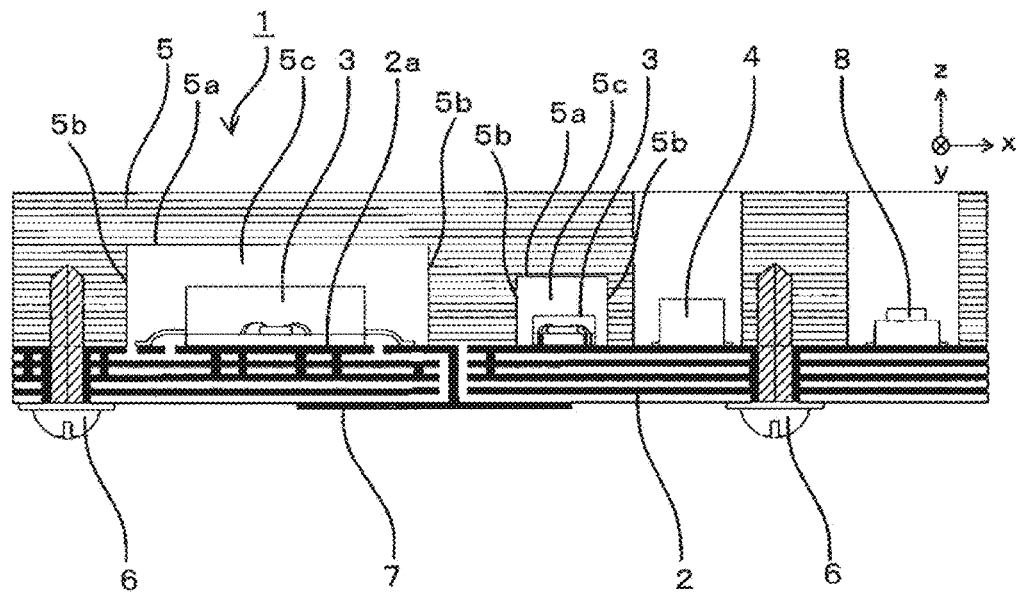
FIG. 1 is a cross-sectional view of a high frequency module according to the first embodiment of the present invention.

The high frequency module according to the first embodiment of the present invention will be hereinafter described with reference to the figures. FIG. 1 shows a cross-sectional view of a high frequency module according to the first embodiment of the present invention. High frequency module 1 is configured such that optional number of high frequency integrated circuits 3 (an FET: Field Effect Transistor, an MIMIC: Monolithic Microwave Integrated Circuit, and the like) and an input connector 4 are mounted on a dielectric multilayer substrate 2. An input signal and a control signal are input into high frequency module 1 through input connector 4. An antenna element 7 is formed on the back surface of dielectric multilayer substrate 2. Antenna element 7 is configured to emit, to the space, a high frequency signal such as a microwave amplified by high frequency integrated circuit 3. For evaluation of the power (high frequency power) of the high frequency signal emitted from antenna element 7, a coaxial connector with change-over switch 8 is arranged immediately before the input terminal of antenna element 7.

Dielectric multilayer substrate 2 is equipped with cutoff block 5 by readily-attachable and detachable fixing means such as a screw 6. Cutoff block 5 is designed to provide an optimal spatial distance so as to ensure space isolation and suppress resonance for the purpose of suppressing oscillation of high frequency integrated circuit 3 caused by resonance of the space and also for the purpose of electromagnetic shielding. Cutoff block 5 is made of a material such as metal having a relatively small heat resistance and having conductivity. Cutoff block 5 is formed of: a cover portion 5a and a plurality of upstanding wall portions 5b formed integrally with this cover portion 5a. Cutoff block 5 houses high frequency integrated circuit 3 in its inside space that is formed by cover portion 5a and upstanding wall portions 5b. Also, cutoff block 5 is fixed to dielectric multilayer substrate 2. The end of each upstanding wall portion 5b of cutoff block 5 on the opposite side to cover portion 5a is in contact with a ground pattern (ground layer) 2a provided on dielectric multilayer substrate 2. The heat generated in high frequency integrated circuit 3 is transferred to ground pattern (ground layer) 2a of dielectric multilayer substrate 2. The heat having been transferred to ground pattern (ground layer) 2a is then transferred to cutoff block 5 and released from cutoff block 5 to the outside of high frequency module 1.

Space (hollow portion) 5c is formed by: dielectric multilayer substrate 2; and the inner area of cutoff block 5 that is formed by cover portion 5a and upstanding wall portions 5b. Cutoff block 5 is connected (grounded) to ground pattern (ground layer) 2a. At a frequency of the high frequency signal to be used or at a prescribed frequency, space (hollow portion) 5c is designed to provide an optimal spatial distance so as to suppress resonance of the high frequency signal. In other words, the distance between the inner surface of cover portion 5a of cutoff block 5 and dielectric substrate 2, and the distance between upstanding wall portions 5b of cutoff block 5 that face each other are set to provide a cutoff frequency of high frequency signal amplified by high frequency integrated circuit 3.

The cutoff frequency is determined by the distance between upstanding wall portions 5b of cutoff block 5 that face each other. Assuming that the distance between upstanding wall portions 5b facing each other is defined as W, a wavelength λc of the cutoff frequency is represented by λc=2 W.

In this case, cutoff frequency fc=c/λc and c=velocity of light.

The space isolation quantity of the sealed space enclosed by metal is simply represented by the following equation.

$$\alpha = \frac{54.6}{\lambda_c} \sqrt{1 - \left(\frac{\lambda_c}{\lambda}\right)^2} \qquad \text{[Equation 1]}$$

In this case, α: space isolation quantity per unit length [dB/mm], λc: wavelength of the cutoff frequency [mm], and λ: wavelength of the frequency amplified by high frequency integrated circuit 3 [mm].

The distance between upstanding wall portions 5b of cutoff block 5 that face each other is set to be smaller than a wavelength λ of a frequency f amplified by high frequency integrated circuit 3, thereby improving the space isolation quantity on the inside of cutoff block 5 in high frequency module 1.

Wavelength λc of the cutoff frequency defined by the distance between the inner surface of cover portion 5a of cutoff block 5 and dielectric substrate 2 is also set in the same manner as wavelength λc of the cutoff frequency defined by the distance between upstanding wall portions 5b of cutoff block 5 that face each other. More specifically, assuming that the distance between the inner surface of cover portion 5a of cutoff block 5 and ground pattern (ground layer) 2a of dielectric substrate 2 is defined as W, wavelength λc of the cutoff frequency is represented by λc=2 W.

Coaxial connector with changeover switch 8 is provided immediately before the input terminal of antenna element 7, so that the characteristics of high frequency module 1 alone can be evaluated. When coaxial connector with changeover switch 8 is provided, a high frequency signal is not input into an antenna element during connection of the coaxial cable, but is output to a test port, so that the characteristics of high frequency module 1 alone can be evaluated. The coaxial cable is not connected during the normal operation, thereby causing a high frequency signal to be input into the end of antenna element 7. When the loss of coaxial connector with changeover switch 8 itself exerts an influence upon the characteristics of high frequency module 1, after evaluation of the characteristics, coaxial connector with changeover switch 8 may be removed and a gold ribbon or the like may be used to cause a short circuit, thereby suppressing losses.

Figure 2:
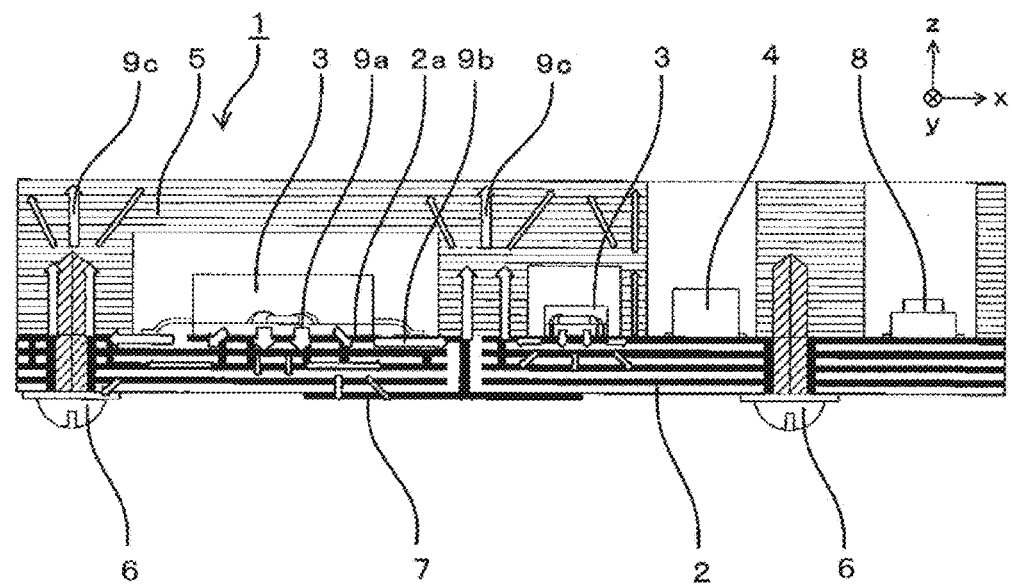
FIG. 2 is a cross-sectional view showing a heat dissipation path in the high frequency module according to the first embodiment of the present invention.
Figure 3:
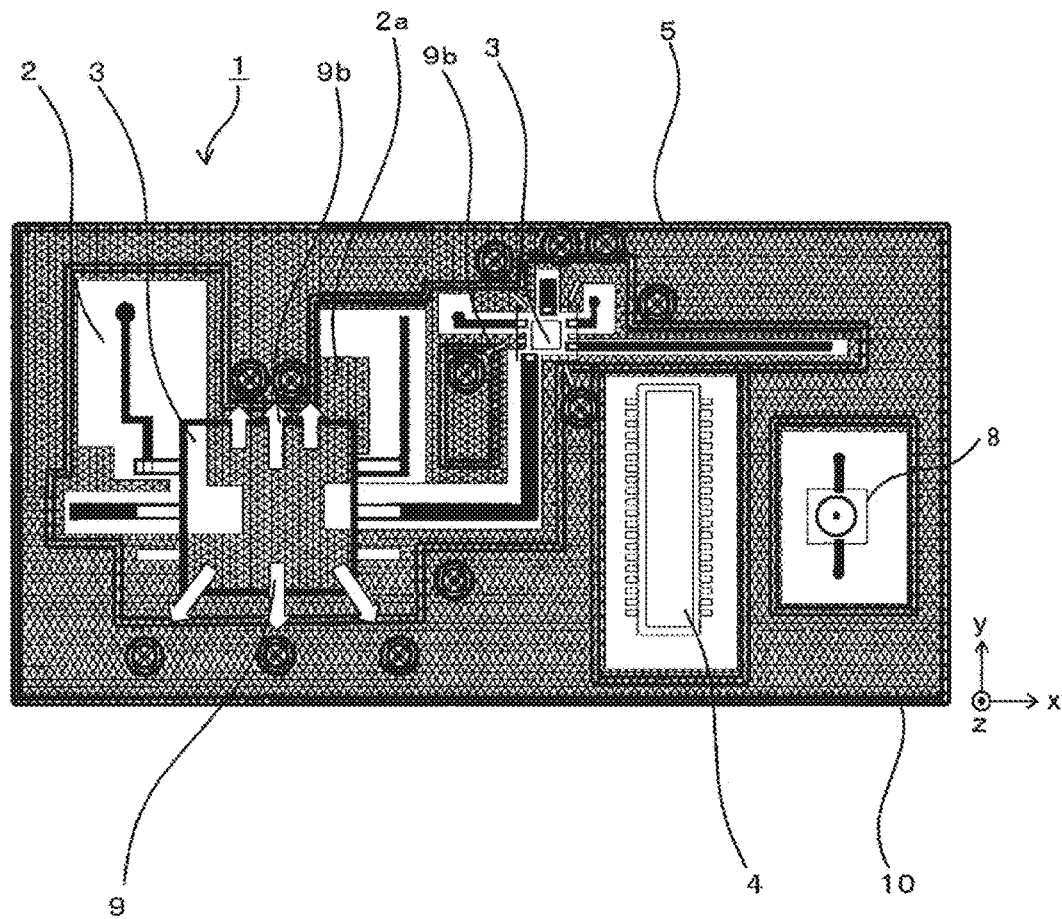
FIG. 3 is a top-plan perspective view showing the heat dissipation path in the high frequency module according to the first embodiment of the present invention.

FIG. 2 is a cross-sectional view showing a heat dissipation path in the high frequency module according to the first embodiment of the present invention. FIG. 3 is a bird's-eye view showing the heat dissipation path in the high frequency module according to the first embodiment of the present invention. In FIGS. 2 and 3, outlined arrows each show a heat transfer path. In FIGS. 2 and 3, since high frequency integrated circuit 3 is mounted while being in contact with ground pattern (ground layer) 2a of dielectric multilayer substrate 2, the heat generated in high frequency integrated circuit 3 is transferred to ground pattern (ground layer) 2a through a heat dissipation path 9a. The heat generated in high frequency integrated circuit 3 and transferred to ground pattern (ground layer) 2a is transferred through ground pattern (ground layer) 2a while passing through a heat dissipation path 9b, and then, transferred to cutoff block 5 through a contact portion between ground pattern (ground layer) 2a and cutoff block 5. The heat generated in high frequency integrated circuit 3 and transferred to cutoff block 5 is transferred through cutoff block 5 while passing through heat dissipation path 9c, and then, dissipated from the surface of cutoff block 5 to the space. In this way, the heat generated in high frequency integrated circuit 3 is transferred to cutoff block 5 through ground pattern (ground layer) 2a of dielectric multilayer substrate 2, and dissipated to the space, thereby achieving high frequency module 1 with improved functions of space isolation for a high frequency signal and heat dissipation.

FIG. 2 is a cross-sectional view showing the state where ground pattern (ground layer) 2a contacted by high frequency integrated circuit 3 is cut so that ground pattern (ground layer) 2a and cutoff block 5 are not in direct contact with each other. However, the actual structure is configured in such a manner that, on the inside of dielectric multilayer substrate 2, ground pattern (ground layer) 2a bypasses high frequency integrated circuit 3 and contacts cutoff block 5, as shown in FIG. 3. Accordingly, the heat generated from high frequency integrated circuit 3 is transferred to cutoff block 5 through ground pattern (ground layer) 2a.

In order to increase the heat dissipation effect of high frequency module 1, there is a way of increasing the thickness of the metal film of ground pattern (ground layer) 2a. Also, a large number of ground vias are provided in the vicinity of heat generating elements such as high frequency integrated circuit 3, thereby increasing the heat dissipation path to increase the area of heat dissipation to the outside. Consequently, the heat dissipation efficiency can be improved. Heat may be transferred not only to ground pattern (ground layer) 2a as a metal layer but also to antenna element 7, which is formed on the backside of the dielectric multilayer substrate, through the dielectric layer of this dielectric multilayer substrate. Thus, this antenna element 7 may be used as a heat sink so as to improve the heat dissipation effect.

Second Embodiment

Figure 4:
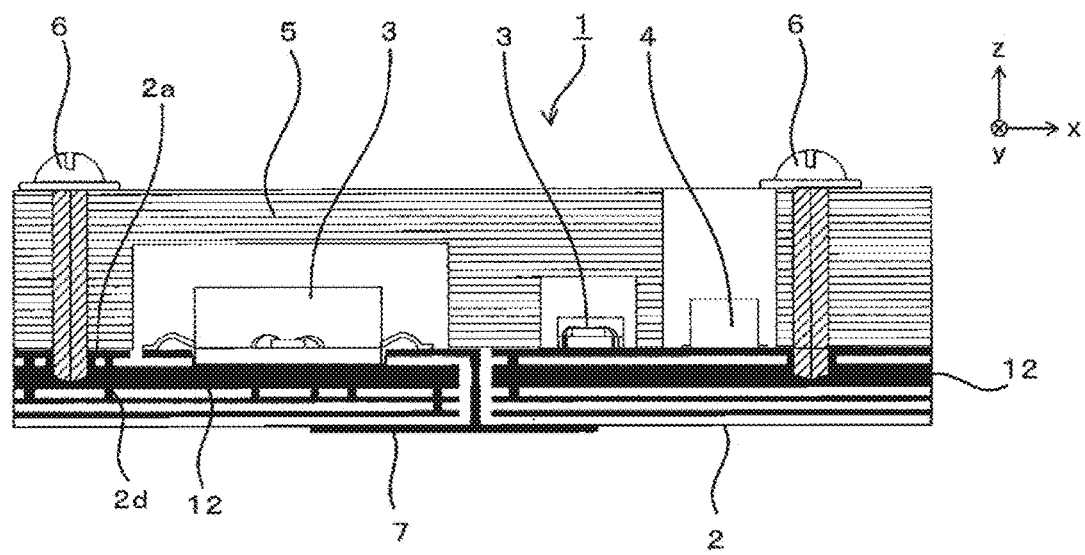
FIG. 4 is a cross-sectional view of a high frequency module according to the second embodiment of the present invention.

The high frequency module according to the second embodiment of the present invention will be hereinafter described with reference to the figures. FIG. 4 shows a cross-sectional view of a high frequency module according to the second embodiment of the present invention. In FIG. 4, the components identical or corresponding to those in FIGS. 1 to 3 are designated by the same reference characters, and the description thereof will not be repeated. The second embodiment of the present invention is obtained by embedding a metal core material 12 such as an aluminum core material in dielectric multilayer substrate 2 in the first embodiment of the present invention. Metal core material 12 is connected electrically and thermally to ground pattern (ground layer) 2a through a ground via 2d.

High frequency integrated circuit 3 is mounted while being in contact with metal core material 12 exposed from dielectric multilayer substrate 2. The heat generated in high frequency integrated circuit 3 is transferred to metal core material 12. Since this metal core material 12 is connected electrically and thermally to ground pattern (ground layer) 2a through ground via 2d formed of a conductive material, the heat is transferred to ground pattern (ground layer) 2a. Also, since metal core material 12 is connected electrically and thermally to ground pattern (ground layer) 2a through ground via 2d formed of a conductive material, this metal core material 12 has the same potential as that of ground pattern (ground layer) 2a and is grounded. The heat dissipation path from cutoff block 5 after the heat is transferred to ground pattern (ground layer) 2a is the same as that in the first embodiment of the present invention.

Metal core material 12 is provided with a screw thread. Thus, cutoff block 5 is attached not by inserting lock screw 6 for the cutoff block from the antenna element 7 side, but by inserting the screw from the cutoff block 5 side. Lock screw 6 is inserted in the Z direction. Accordingly, since the heat generated in high frequency integrated circuit 3 and transferred to metal core material 12 is transferred from metal core material 12 directly to cutoff block 5, the heat resistance falls below the heat resistance on the heat transfer path extending through ground pattern (ground layer) 2a, so that the heat dissipation efficiency is improved.

When a screw thread is provided in an area from the surface of cutoff block 5 on the opposite side to metal core material 12 (the surface on the X-Y plane) over metal core material 12, lock screw 6 made of metal can be prevented from being exposed on the antenna element 7 side. Thus, in high frequency module 1, lock screw 6 made of metal and provided for attaching cutoff block 5 does not exist on the antenna element 7 side, so that the radiation characteristics of antenna element 7 can be less influenced. In other words, it can be said that the flexibility of the layout for attachment of lock screw 6 to high frequency module 1 is improved.

Third Embodiment

The high frequency module according to the third embodiment of the present invention will be hereinafter described with reference to the figures. FIG. 5 shows a cross-sectional view of a high frequency module according to the third embodiment of the present invention. In FIG. 5, the components identical or corresponding to those in FIGS.

1 to 3 are designated by the same reference characters, and the description thereof will not be repeated. The third embodiment of the present invention is obtained by forming a radiation fin 13 on cutoff block 5 in the first embodiment of the present invention.

When radiation fin 13 is formed on cutoff block 5, the area of heat exchange with atmospheric air can be increased, thereby improving the heat dissipation efficiency of high frequency module 1.

In the third embodiment of the present invention, a controlling IC 16 and a controlling chip element 17 are mounted on a control circuit 15, which is then placed on cutoff block 5 and mounted thereon.

In the configuration in which antenna element 7 is formed on the back surface of dielectric multilayer substrate 2, a plurality of high frequency modules 1 are coupled as active phased array antennas, in which case the antenna pitch between antenna elements 7 is limited by the area of high frequency module 1. According to the third embodiment of the present invention, when a control substrate exerting relatively less influence upon the high frequency performance is produced as a separate substrate and connected to a high frequency substrate through a cable or the like, the area of high frequency module 1 can be reduced. In the case where an active phased array antenna for coupling a plurality of high frequency modules 1 is formed, the restrictions on the distance of the antenna pitch can be reduced in proportion to the area that can be reduced.

Fourth Embodiment

The high frequency module according to the fourth embodiment of the present invention will be hereinafter described with reference to the figures. FIG. 6 shows a cross-sectional view of a high frequency module according to the fourth embodiment of the present invention. In FIG. 6, the components identical or corresponding to those in FIGS. 1 to 3 are designated by the same reference characters, and the description thereof will not be repeated. The fourth embodiment of the present invention is obtained by forming a water-cooling heat pipe 14 in cutoff block 5 according to the first embodiment of the present invention.

By forming water-cooling heat pipe 14 in cutoff block 5, cutoff block 5 is forcibly cooled, so that the heat exchange efficiency can be increased, thereby improving the heat dissipation efficiency of high frequency module 1.

Fifth Embodiment

The high frequency module according to the fifth embodiment of the present invention will be hereinafter described with reference to the figures. FIG. 7 shows a cross-sectional view of a high frequency module according to the fifth embodiment of the present invention. In FIG. 7, the components identical or corresponding to those in FIGS. 1 to 3 are designated by the same reference characters, and the description thereof will not be repeated. The fifth embodiment of the present invention is obtained by modifying the first embodiment of the present invention in such a manner that a package of high frequency integrated circuit 3 is mounted upside down so as to bring cutoff block 5 and high frequency integrated circuit 3 into direct contact with each other. In order to increase the amount of heat transfer, it is necessary to improve the contact performance between the package of high frequency integrated circuit 3 and cutoff block 5. The package of high frequency integrated circuit 3 is subjected to a screw processing treatment, and cutoff block 5 is attached to dielectric multilayer substrate 2. In this way, after this attachment, a screw 18 is used to improve the contact performance between the package of high frequency integrated circuit 3 and cutoff block 5. Specifically, screw 18 inserted from the cutoff block 5 side is used and fitted in a screw processing portion provided in the package of high frequency integrated circuit 3, which is then pulled closer to cutoff block 5, thereby improving the contact performance therebetween. Screw 18 is inserted in the Z direction.

When it is desired that the heat generated from high frequency integrated circuit 3 is dissipated also from the dielectric multilayer substrate 2 side, the heat may be dissipated via a radiation sheet 19 or the like so as to pass through dielectric multilayer substrate 2 as in the first embodiment of the present invention.

By the configuration formed as described above, main heat dissipation paths do not pass through dielectric multilayer substrate 2, so that mounting can be implemented without limitation of the temperature conditions for dielectric multilayer substrate 2. Furthermore, since cutoff block 5 is made generally using a material such as metal with excellent heat conductivity, the heat dissipation efficiency of high frequency module 1 can be improved.

Furthermore, a lead end face 3a of high frequency integrated circuit 3 is solder-connected. When high frequency integrated circuit 3 is pulled closer to cutoff block 5 by means of screw 18 in order to bring high frequency integrated circuit 3 into contact with cutoff block 5, stress concentration occurs at lead end face 3a, which may cause reliability concerns about occurrence of cracking and the like. When the lead structure is formed as a bending structure, attachment can be performed without exerting influence upon reliability, such as occurrence of solder cracking.

Sixth Embodiment

Figure 8:
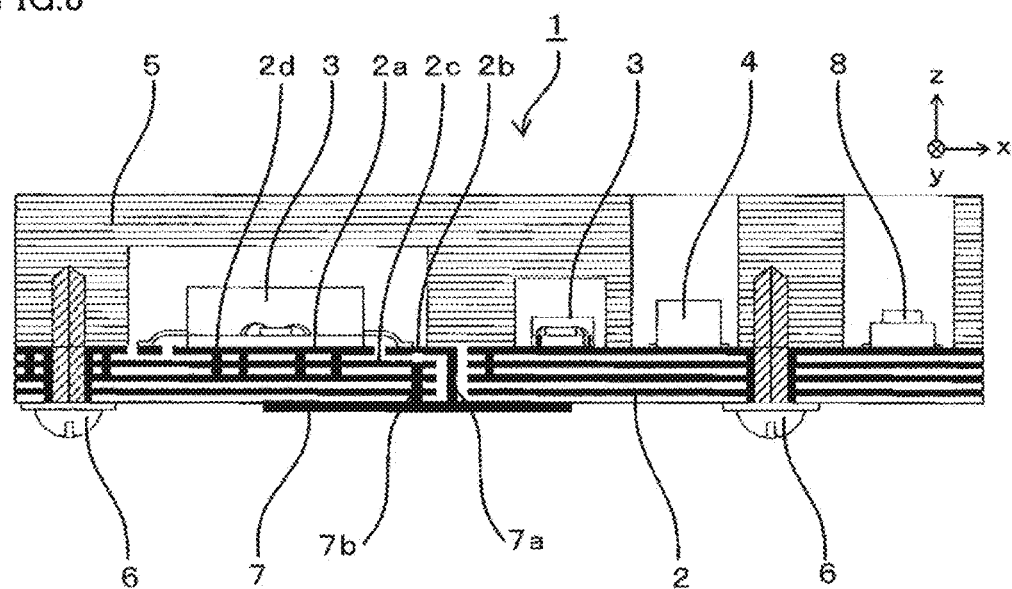
FIG. 8 is a cross-sectional view of a high frequency module according to the sixth embodiment of the present invention.

The high frequency module according to the sixth embodiment of the present invention will be hereinafter described with reference to the figures. FIG. 8 shows a cross-sectional view of a high frequency module according to the sixth embodiment of the present invention. In FIG. 8, the components identical or corresponding to those in FIGS. 1 to 3 are designated by the same reference characters, and the description thereof will not be repeated. In the sixth embodiment of the present invention, antenna element 7 is also used as a heat dissipation path in addition to the first embodiment of the present invention.

In the case where antenna element 7 is a planar antenna such as a micro-strip antenna and a reverse F antenna, the electric field strength distribution within antenna element 7 exhibits a zero point at which the electric field strength becomes a zero potential. Even if this zero point is mechanically connected to a ground pattern (ground layer) forcibly with a conductor, the electrical characteristics of antenna element 7 are not influenced thereby. In other words, when the zero point of antenna element 7 is connected to the ground pattern (ground layer) with a conductor, the heat generated in high frequency integrated circuit 3 can be dissipated without exerting influence upon the electrical characteristics of antenna element 7. Specifically, the heat generated in high frequency integrated circuit 3 and transferred to the ground pattern (ground layer) is transferred from the ground pattern (ground layer) through a zero point of antenna element 7 to antenna element 7 that is provided on the back surface of dielectric multilayer substrate 2 and exposed to the external space. Then, the transferred heat is dissipated from the surface of antenna element 7 to the external space.

In FIG. 8, antenna element 7 is a micro strip antenna, and also, a power feed line 7a of antenna element 7 and the lead of high frequency integrated circuit 3 are connected to each other via a signal pattern 2b provided on the surface of dielectric multilayer substrate 2.

In the micro strip antenna, the center portion of antenna element 7 is a zero point. The zero point in the center portion of antenna element 7 is connected through a ground line 7b to an internal layer ground pattern (ground layer) 2c formed in the internal layer of dielectric multilayer substrate 2. Internal layer ground pattern (ground layer) 2c is connected through a ground via 2d formed of a conductive material to ground pattern (ground layer) 2a provided on the surface of dielectric multilayer substrate 2 contacted by high frequency integrated circuit 3.

Figure 9:
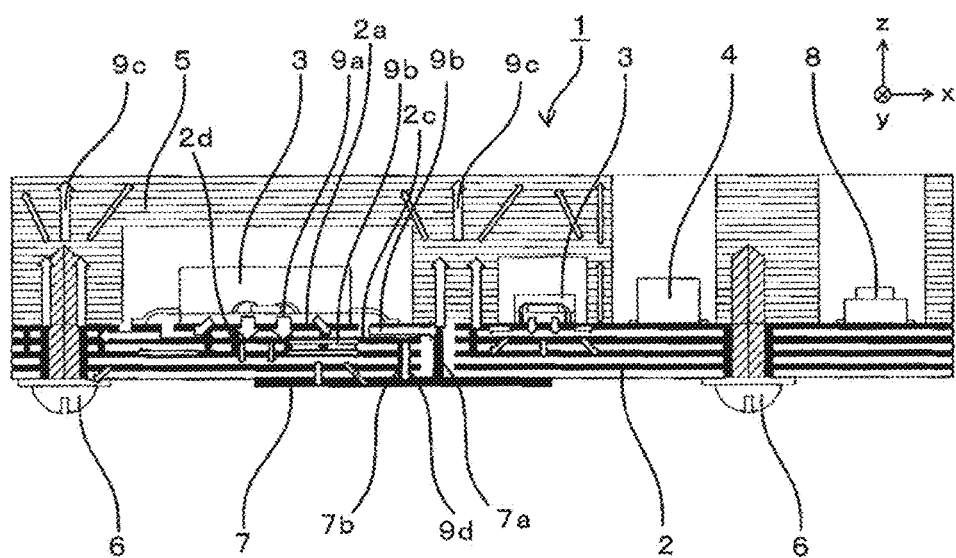
FIG. 9 is a cross-sectional view showing a heat dissipation path in the high frequency module according to the sixth embodiment of the present invention.

FIG. 9 is a cross-sectional view showing a heat dissipation path of a high frequency module according to the sixth embodiment of the present invention. In FIG. 9, outlined arrows each show a heat transfer path. In FIG. 9, since high frequency integrated circuit 3 is mounted while being in contact with ground pattern (ground layer) 2a of dielectric multilayer substrate 2, the heat generated in high frequency integrated circuit 3 is transferred to ground pattern (ground layer) 2a through heat dissipation path 9a. The heat generated in high frequency integrated circuit 3 and transferred to ground pattern (ground layer) 2a is transferred through ground pattern (ground layer) 2a while passing through heat dissipation path 9b, and then, transferred to cutoff block 5 through a contact portion between ground pattern (ground layer) 2a and cutoff block 5. The heat generated in high frequency integrated circuit 3 and transferred to cutoff block 5 is transferred through cutoff block 5 while passing through heat dissipation path 9c, and then, dissipated from the surface of cutoff block 5 to the space.

FIG. 9 shows a cross section in which ground pattern (ground layer) 2a contacted by high frequency integrated circuit 3 is cut, so that ground pattern (ground layer) 2a and cutoff block 5 are not in direct contact with each other. However, the actual structure is configured in such a manner that, on the inside of dielectric multilayer substrate 2, ground pattern (ground layer) 2a bypasses high frequency integrated circuit 3 and contacts cutoff block 5, as shown in FIG. 3. Accordingly, the heat generated from high frequency integrated circuit 3 is transferred to cutoff block 5 through ground pattern (ground layer) 2a.

In FIG. 9, since high frequency integrated circuit 3 is mounted while being in contact with ground pattern (ground layer) 2a of dielectric multilayer substrate 2, the heat generated in high frequency integrated circuit 3 is transferred to ground pattern (ground layer) 2a through heat dissipation path 9a. The heat generated in high frequency integrated circuit 3 and transferred to ground pattern (ground layer) 2a is transferred through a ground via 2d to internal layer ground pattern (ground layer) 2c. The heat generated in the high frequency integrated circuit and transferred to internal layer ground pattern (ground layer) 2c is transferred through internal layer ground pattern (ground layer) 2c while passing through heat dissipation path 9b, and then, transferred to ground line 7b. The heat generated in the high frequency integrated circuit and transferred to ground line 7b is transferred through ground line 7b while passing through heat dissipation path 9d, and transferred to antenna element 7, and then, dissipated from the surface of antenna element 7 to the space.

In this way, high frequency module 1 serves to cause the heat generated in high frequency integrated circuit 3 to be transferred through ground pattern (ground layer) 2a of dielectric multilayer substrate 2 to cutoff block 5 and antenna element 7 to thereby dissipate the heat to the space. Therefore, a high frequency module 1 with improved functions of space isolation for a high frequency signal and heat dissipation can be achieved.

The configuration of high frequency module 1 having been described in each of the first to sixth embodiments of the present invention may be obtained by combining these embodiments with each other in addition to individual implementation of each of these embodiments.

REFERENCE SIGNS LIST 1 high frequency module, 2 dielectric multilayer substrate, 2a ground pattern (ground layer), 2b signal pattern, 2c internal layer ground pattern (ground layer), 2d ground via, 3 high frequency integrated circuit, 3a lead end face, 4 input connector, 5 cutoff block, 5a cover portion, 5b upstanding wall portion, 5c space (hollow portion), 6 lock screw, 7 antenna element, 7a power feed line, 7b ground line, 8 coaxial connector with changeover switch, 9a, 9b, 9c, 9d heat dissipation path, 12 metal core material, 13 radiation fin, 14 water-cooling heat pipe, 15 control circuit, 16 controlling IC, 17 controlling chip element, 18 screw, 19 radiation sheet.

The invention claimed is:

1. A high frequency module comprising:
   a dielectric multilayer substrate with a high frequency electronic component mounted thereon, the high frequency electronic component including a heat generating portion; and
   a first ground pattern formed on the dielectric multilayer substrate and being in contact with the high frequency electronic component;
   a block formed of an upstanding wall portion and a cover portion that covers the upstanding wall portion, the block housing the high frequency electronic component and being provided with a hollow portion between the cover portion and a surface of the high frequency electronic component on an opposite side to a surface thereof that is in contact with the first ground pattern, the block being provided with an opening portion exposing the dielectric multilayer substrate, a part of the block excluding the hollow portion and the opening portion being configured as the upstanding wall portion and being formed on the dielectric multilayer substrate; and
   a second ground pattern separated from the first ground pattern, formed on the dielectric multilayer substrate and being in contact with the upstanding wall portion, the first ground pattern and the second ground pattern being connected to each other on an inside of the dielectric multilayer substrate, and-heat generated in the heat generating portion being transmitted from the first ground pattern through the second ground pattern to the block.

2. The high frequency module according to claim 1, wherein the first ground pattern is a metal core exposed from the dielectric multilayer substrate.

3. The high frequency module according to claim 2, wherein
   the dielectric multilayer substrate has
      one surface on which the high frequency electronic component and the block are mounted, and another surface on which an antenna element connected to the high frequency electronic component is provided.

4. The high frequency module according to claim 1, wherein
the dielectric multilayer substrate has
one surface on which the high frequency electronic component and the block are mounted, and
another surface on which an antenna element connected to the high frequency electronic component is provided.

5. A high frequency module comprising:
a dielectric multilayer substrate with a high frequency electronic component mounted thereon, the high frequency electronic component including a heat generating portion; and
a first ground pattern formed on the dielectric multilayer substrate and being in contact with the high frequency electronic component;
a block formed of an upstanding wall portion and a cover portion that covers the upstanding wall portion, the block housing the high frequency electronic component and being provided with a hollow portion, the hollow portion being provided by pulling the high frequency electronic component close to the cover portion to cause the cover portion to come into contact with a surface of the high frequency electronic component on an opposite side to a surface thereof that is in contact with the first ground pattern such that the hollow portion is located between the cover portion and the surface of the high frequency electronic component on the opposite side;
a second ground pattern separated from the first ground pattern, formed on the dielectric multilayer substrate and being in contact with the upstanding wall portion; and
a lead end face of the high frequency electronic component, the lead end face being solder-connected on the dielectric multilayer substrate between the first ground pattern and the second ground pattern,
the first ground pattern and the second ground pattern being connected to each other on an inside of the dielectric multilayer substrate, and
the lead end face being formed as a bending structure.

6. The high frequency module according to claim 5, wherein the high frequency electronic component and the first ground pattern are in contact with each other with a radiation sheet interposed therebetween.

7. The high frequency module according to claim 6, wherein
the dielectric multilayer substrate has
one surface on which the high frequency electronic component and the block are mounted, and
another surface on which an antenna element connected to the high frequency electronic component is provided.

8. The high frequency module according to claim 5, wherein
the dielectric multilayer substrate has
one surface on which the high frequency electronic component and the block are mounted, and
another surface on which an antenna element connected to the high frequency electronic component is provided.

* * * * *